United States Patent [19]

Sheffer

[11] Patent Number: 6,072,150
[45] Date of Patent: Jun. 6, 2000

[54] APPARATUS AND METHOD FOR IN-LINE SOLDERING

[75] Inventor: Michael Sheffer, Givat Ela, Israel

[73] Assignee: Beamworks Ltd., Migdal Haemek, Israel

[21] Appl. No.: 09/237,251

[22] Filed: Jan. 26, 1999

Related U.S. Application Data

[63] Continuation-in-part of application No. 09/084,374, May 27, 1998.

[51] Int. Cl.[7] .................................................. B23K 26/03
[52] U.S. Cl. ................................ 219/121.83; 219/121.76; 219/121.85
[58] Field of Search ........................ 219/121.62, 121.64, 219/121.76, 121.83, 121.85; 228/103, 104; 374/2, 4; 250/341.1, 341.5, 341.6, 341.7, 252.1

[56] References Cited

U.S. PATENT DOCUMENTS

| | | | |
|---|---|---|---|
| 4,657,169 | 4/1987 | Dostoomian et al. | 228/103 |
| 4,696,104 | 9/1987 | Vanzetti et al. | |
| 4,792,683 | 12/1988 | Chang et al. | 250/341.6 |
| 4,979,290 | 12/1990 | Chiba . | |
| 4,998,005 | 3/1991 | Rathi et al. | |
| 5,041,714 | 8/1991 | Funk | 219/121.62 |
| 5,164,565 | 11/1992 | Addiego et al. | |
| 5,164,566 | 11/1992 | Spletter et al. | |
| 5,227,604 | 7/1993 | Freedman . | |
| 5,359,203 | 10/1994 | Hashii et al. | |
| 5,413,275 | 5/1995 | Verguld et al. | |
| 5,500,502 | 3/1996 | Horita et al. | 219/121.63 |
| 5,530,221 | 6/1996 | Benda et al. | 219/121.83 |
| 5,602,389 | 2/1997 | Kato et al. | 250/252.1 |
| 5,680,698 | 10/1997 | Armington et al. | |

OTHER PUBLICATIONS

Vanzetti, "Simultaneous solder and inspection by laser–infrared," SMTA Proceedings of Surface Mount 90, 1990, pp. 89–104.

Nicolics et al., "Selection of IR detectors for a fast laser soldering process with simultaneous solder joint qualification," IEEE Transactions on Components, Part B, vol. 17, No. 4, Nov. 1994, pp. 596–602.

*Primary Examiner*—Gregory Mills
*Attorney, Agent, or Firm*—Mark M. Friedman

[57] ABSTRACT

An apparatus and method for thermal processing of a workpiece in an assembly line. The workpiece is carried by a conveyor into a target zone, where one or more optical systems aim multiple radiation beams of a first wavelength at selected locations on the workpiece to heat those locations. Infrared radiation resulting from that heating is monitored for process quality control. Depending on the time profile of the infrared radiation, the workpiece may be diverted for reprocessing or discarded. Each optical systems is translated as a whole with respect to the workpiece, so that the beams can be aimed at a relatively large flat workpiece at incidence angles that do not depart excessively from vertical. The conveyor is transparent to the radiation beams, and a sensor, placed on the other side of the conveyor from the aiming mechanism, is used to calibrate the aim of the optical systems. The apparatus is calibrated with respect to time profiles by directing radiation beams of a second wavelength at similar locations on a calibration piece to heat those locations and recording the intensity of the resulting infrared radiation.

4 Claims, 7 Drawing Sheets

APPARATUS AND METHOD FOR IN-LINE SOLDERING

This is a continuation in part of U.S. patent application Ser. No. 09/084,374 filed May 27, 1998.

FIELD AND BACKGROUND OF THE INVENTION

The present invention relates to the fabrication of electronic devices and, more particularly, to in-line soldering of electronic components onto circuit boards.

FIG. 1 shows, schematically, a portion of an assembly line for electronic devices. In a paste printer 10, solder paste is printed on circuit boards where leads of electronic components, such as packaged integrated circuit chips, are to be soldered to conductors on the circuit boards. In a pick and place station 12, components are placed in the appropriate locations on the circuit boards. In a reflow oven 14, the circuit boards, with the components in place, are heated by circulating hot air to melt the solder paste, thereby soldering the components onto the circuit boards. The arrows in FIG. 1 indicate the direction of movement of the circuit boards. This process typically is fully automatic.

FIGS. 2A through 2F illustrate six things that can go wrong in this process before the components are soldered to the circuit boards in reflow oven 14. FIG. 2A is a side view of a defective component 18 mounted on a circuit board 16 and ready for soldering. Two leads 20a and 20b are shown emerging from the side of component 18. Lead 20a is in contact with a corresponding solder paste bead 22a. Lead 20b is bent upwards and not in contact with a corresponding solder paste bead 22b. When circuit board 16 is heated in reflow oven 14, component 18 is incompletely soldered to circuit board 16. FIG. 2B is a plan view of another component 18' mounted on circuit board 16 and ready for soldering. Most solder paste beads 22 are in contact with only one lead 20' of component 18'. Solder paste bead 22' has been printed incorrectly by paste printer 10 and is in contact with two leads 20'. Solder paste bead 22' short circuits the two leads 20' with which it is in contact. FIG. 2C is a plan view of circuit board 16 where pick and place station 12 has failed to place a component in contact with solder paste beads 22. FIG. 2D is a plan view of component 18' translated with respect to solder paste beads 22. FIG. 2E is a plan view of component 18' rotated with respect to solder paste beads 22. FIG. 2F is a side view of two components 18' and 18" mounted one above the other on circuit board 16. Leads 20' of component 18' are in contact with solder paste beads 22, but leads 20" of component 18" are suspended above leads 20' and mask leads 20' and solder paste beads 20.

Because of assembly defects such as those illustrated in FIGS. 2A through 2F, circuit boards 16 are inspected upon emerging from reflow oven 14, either manually, or automatically in an automatic inspection station, and defective circuit boards 16 are either repaired in a rework station or discarded. This extra step of inspection outside of reflow oven 14 detracts from the productivity of the assembly line. There is thus a widely recognized need for, and it would be highly advantageous to have, an in-line apparatus and method for soldering electronic components to circuit boards that automatically inspects the solder joints as they are formed.

SUMMARY OF THE INVENTION

According to the present invention there is provided a method of thermal processing of at least one workpiece location on a workpiece, to produce a processed workpiece, including the steps of: (a) providing a calibration piece including at least one calibration location, each the at least one calibration location being representative of a corresponding workpiece location on the processed workpiece; (b) generating radiation of a first wavelength; (c) for each of the at least one calibration location: (i) aiming the radiation of the first wavelength at the each calibration location, and (ii) detecting intensity of radiation of a second wavelength emitted from the each calibration location when the radiation of the first wavelength impinges on the each calibration location; (d) generating radiation, of a third wavelength, having an intensity sufficient to effect the thermal processing; and (e) for each of the at least one workpiece location: (i) aiming the radiation of the third wavelength at the each workpiece location, (ii) detecting intensity of radiation of the second wavelength emitted from the each workpiece location when the radiation of the third wavelength impinges on the each calibration location, (iii) comparing the intensity of the radiation of the second wavelength, emitted from the each workpiece location, with the intensity of the radiation of the second wavelength, emitted from the calibration location representative of the each workpiece location, and (iv) based on the comparing, deciding whether to divert the workpiece for individual processing.

Although the illustrative examples herein are directed at in-line soldering of electronic components to circuit boards, it will be appreciated that the principles of the present invention are applicable to many other similar industrial processes in which a workpiece is heated locally, for example spot welding or engraving.

The apparatus of the present invention replaces reflow oven 14 in the assembly line. Multiple laser beams are aimed at leads 20 on each circuit board 16 that enters the apparatus, to heat leads 20 and solder paste 22, thereby melting solder paste beads 22 and forming solder joints between leads 20 and the conductors of circuit board 16. Each laser beam heats one lead 20 and one solder paste bead 22 at a time. Meanwhile, infrared emissions from each lead 20 and solder paste bead 22 being heated are monitored, to measure the temperature of the incipient solder joint as a function of time. The temperature of normal leads 20a and solder paste beads 22a is a function of time that can be established experimentally, as was done, for example, by Johann Nicolics, Laszlo Musiejovsky and E. Semerad ("Optimization of process parameters for laser soldering of surface mounted devices", *IEEE Transactions on Components, Hybrids and Manufacturing Technology* vol. 15 no. 6, December 1992, p. 1155.) The defect illustrated in FIG. 2A is characterized by an abnormally fast temperature rise time, The defect illustrated in FIG. 2B is characterized by an abnormally slow temperature rise time. The defect illustrated in FIG. 2C is characterized by multiple abnormally fast temperature rise times. The defect illustrated in FIG. 2D is characterized by abnormally fast temperature rise times on two of the four sides of component 18'. The defect illustrated in FIG. 2E is characterized by abnormally fast temperature rise times along portions of all four sides of component 18'. The defect illustrated in FIG. 2F is characterized by multiple ab normally slow temperature rise times. If the defects of FIGS. 2A through 2F are detected, component 18, 18' and/or 18" are removed from circuit board 16, the relevant portion of circuit board 16 is cleaned of solder, and circuit board 16 is returned to paste printer 10 or directed to a rework station for local reprocessing. Alternatively, a defective circuit board 16 is discarded.

Alternatively, and preferably, the temperature profile, as a function of time, of normal leads 20a and solder paste beads 22a is determined by providing a calibration piece, which is an instance of a properly assembled circuit board 16, directing multiple laser beams at the leads of the components on the calibration piece, and recording the infrared emissions from those leads.

For the apparatus of the present invention to function properly, the laser beams must be aimed accurately. Therefore, the present invention is provided with an aiming calibration mechanism. The conveyor belt that carries circuit boards 16 within the apparatus is transparent to the laser beams. On the side of the conveyor belt opposite the laser beam aiming optics is a position-sensitive light sensor, such as a CCD array. The aiming is calibrated by aiming the laser beams at a nominal aiming point on the sensor, noting the departure of the actual impact from this aiming point, and adjusting the aim accordingly. This calibration is done in between solderings of different circuit boards 16, when the aiming optics has a clear shot at the sensor.

It should be noted that the general concept of soldering with multiple laser beams and concurrent monitoring of the temperature of the incipient solder joints has been discussed in the literature, for example by Robert W. Messler Jr. and Don L. Millard in "Laser soldering: new light on an old joining process", *Welding Journal*, October 1994, pp. 43–48. Nevertheless, until now this general concept has not been implemented in practice. One of the innovations of the present invention that enables the practical implementation of this concept is the use of a mechanical translational mechanism for coarse positioning of the lasers and associated aiming optics with respect to circuit board 16. The footprint of a collimated laser beam on circuit board 16 is proportional to the cosecant of the angle of the laser beam to circuit board 16. If only an optical system is used to aim the laser beam, the optical system must include relatively complicated focusing mechanisms for precise aiming of the laser beams at large departures from vertical incidence. The use of a translational mechanism for preliminary coarse positioning allows the optical aiming system to be much simpler than would be possible otherwise.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of an apparatus and method for fast, accurate, controlled local heating of a workpiece. Specifically, the present invention can be used for in-line soldering of electronic components to circuit boards.

The principles and operation of localized thermal processing of a workpiece according to the present invention may be better understood with reference to the drawings and the accompanying description.

Figure 1:
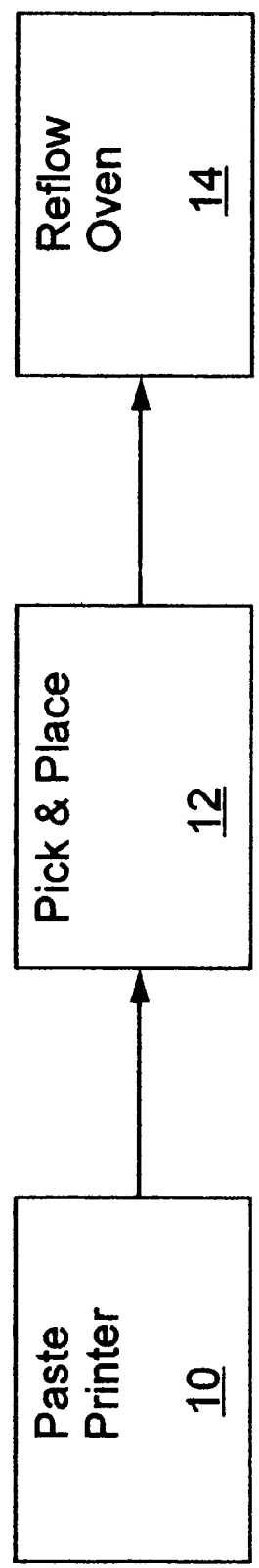
FIG. 1 (prior art) is a portion of a conventional assembly line for electronic devices.
Figure 2A:
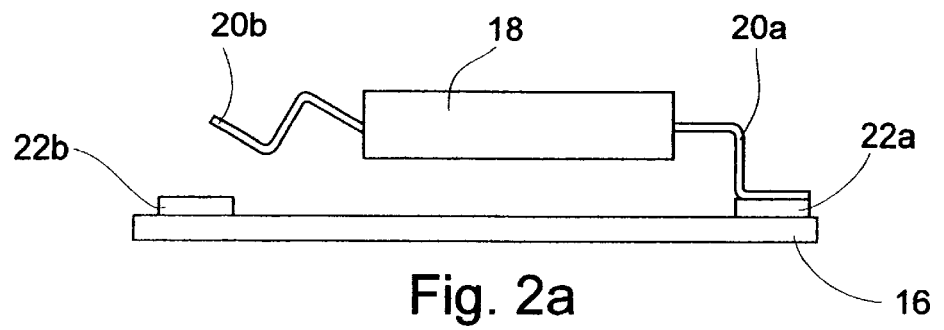
FIGS. 2A through 2F illustrate six things that can go wrong in the soldering of a component to a circuit board.
Figure 2B:
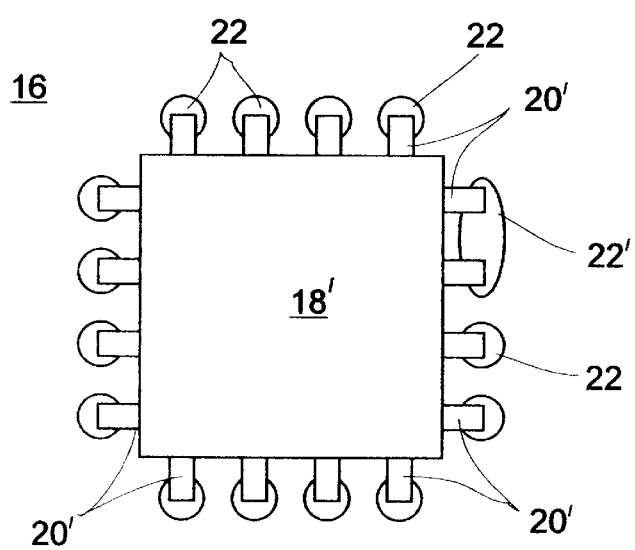
Figure 2C:
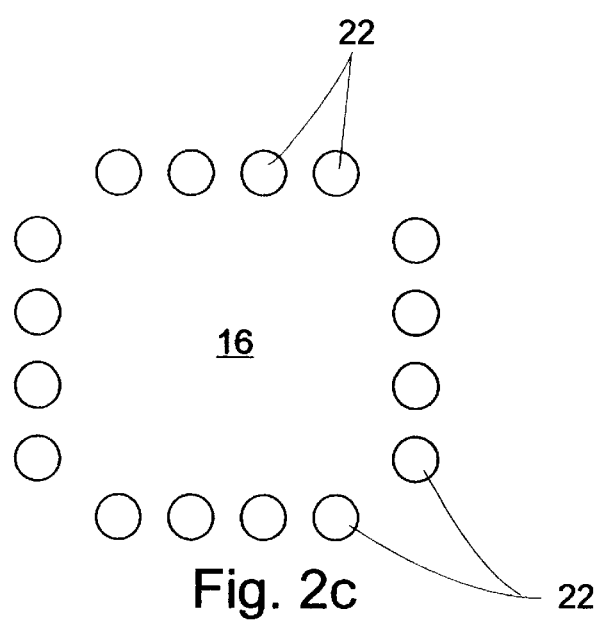
Figure 2D:
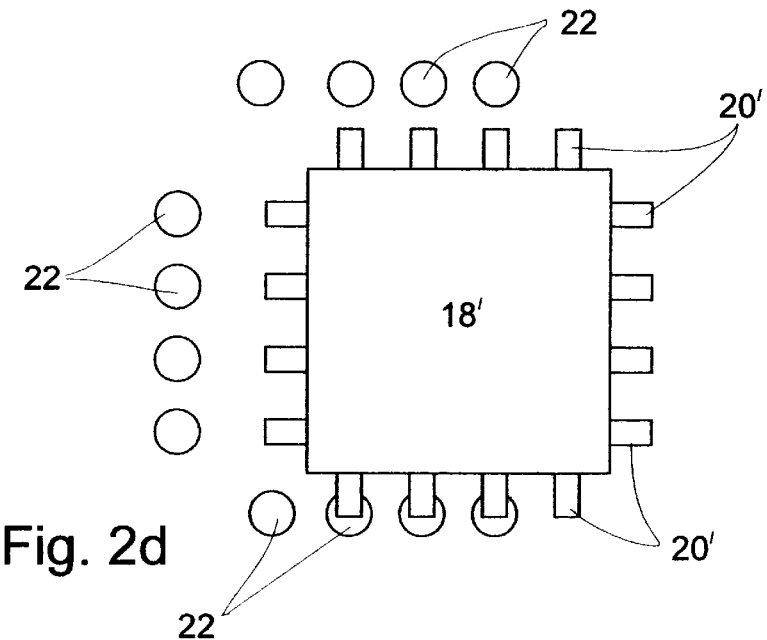
Figure 2E:
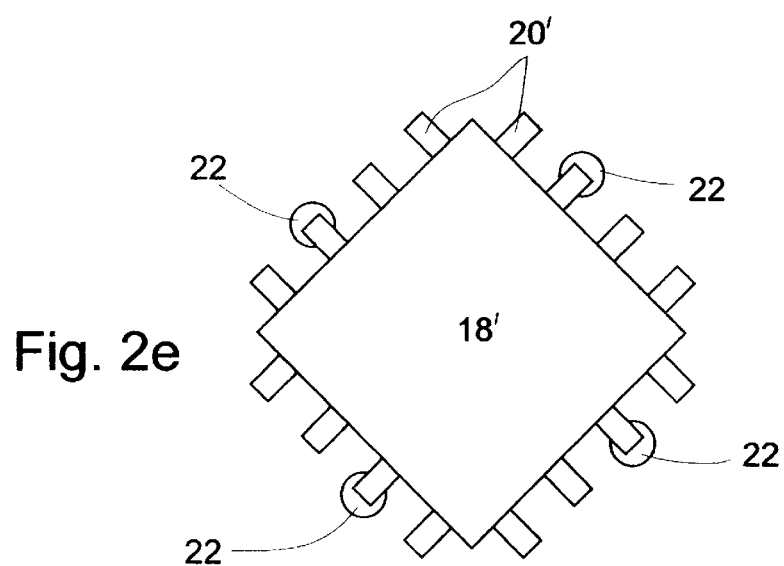
Figure 2F:
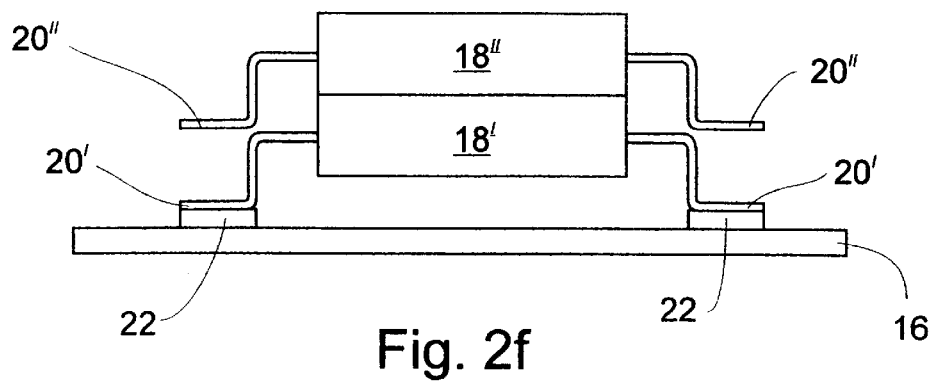
Figure 3:
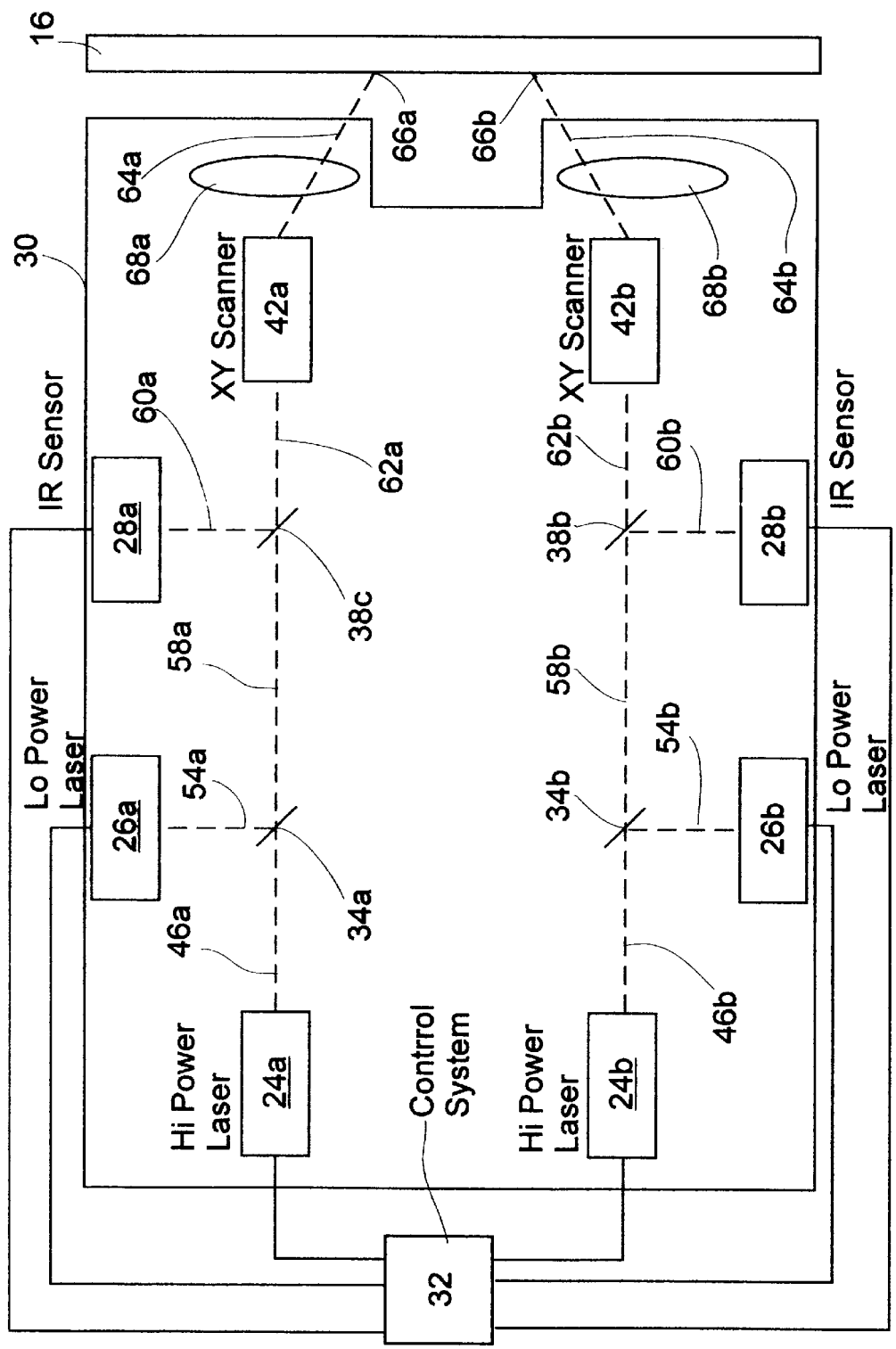
FIG. 3 is a schematic illustration of an optical system of the apparatus of the present invention.

Referring again to the drawings, FIG. 3 illustrates schematically an optical system 30 of an apparatus of the present invention. System 30 includes high power lasers 24 operating at a first wavelength, low power lasers 26 operating at a second wavelength different from the first wavelength, infrared sensors 28 sensitive to wavelengths longer than the first wavelength, xy scanners 42, and several reflectors. Reflectors 34 are beamsplitters, such as dichroic mirrors, that are transparent to light from lasers 24 and reflective of light from lasers 26. Reflectors 38 are similarly transparent to light from lasers 24 and 26 and reflective of infrared light detected by sensors 28.

A collimated beam of light from each laser 24 follows optical path segments 46, 58 and 62 to the corresponding xy scanner 42. xy scanners 42 aim light from lasers 24 simultaneously via focusing optics 68 at aiming points 66 on a workpiece such as circuit board 16 along optical path segments 64. As an aiming point 66 is heated by light from a laser 24, some of the consequent infrared light emitted at point 66 travels back along optical path segments 64, 62 and 60 to the corresponding infrared sensor 28. The function of lasers 26 is described below.

Although only two optical channels a and b are illustrated in FIG. 3, this is done only for clarity and simplicity. It is clear that beams from any number of lasers can be aimed simultaneously at circuit board 16, the preferred number of such laser beams being 16, so that 16 solder joints can be formed at the same time.

Lasers suitable for use as high power lasers 24 include the model FD35 available from SDL Inc. of San Jose Calif., which provides 25 Watts of power at a wavelength of 810 nanometers, and the model DL50 available from Fisba Optics AG of St. Gallen, Switzerland. Low power lasers 26 preferably are 0.5 Watt He—Ne lasers. Sensors suitable for use as infrared sensors 28 include germanium, InGaAs and PbS sensors that respond to wavelengths between 1.5 microns and 3 microns and that are available from Hamamatsu Corp. of Hamamatsu City, Japan. Suitable xy scanners include the model M3 available from General Scanning Corp. of Watertown Mass.

Figure 4A:
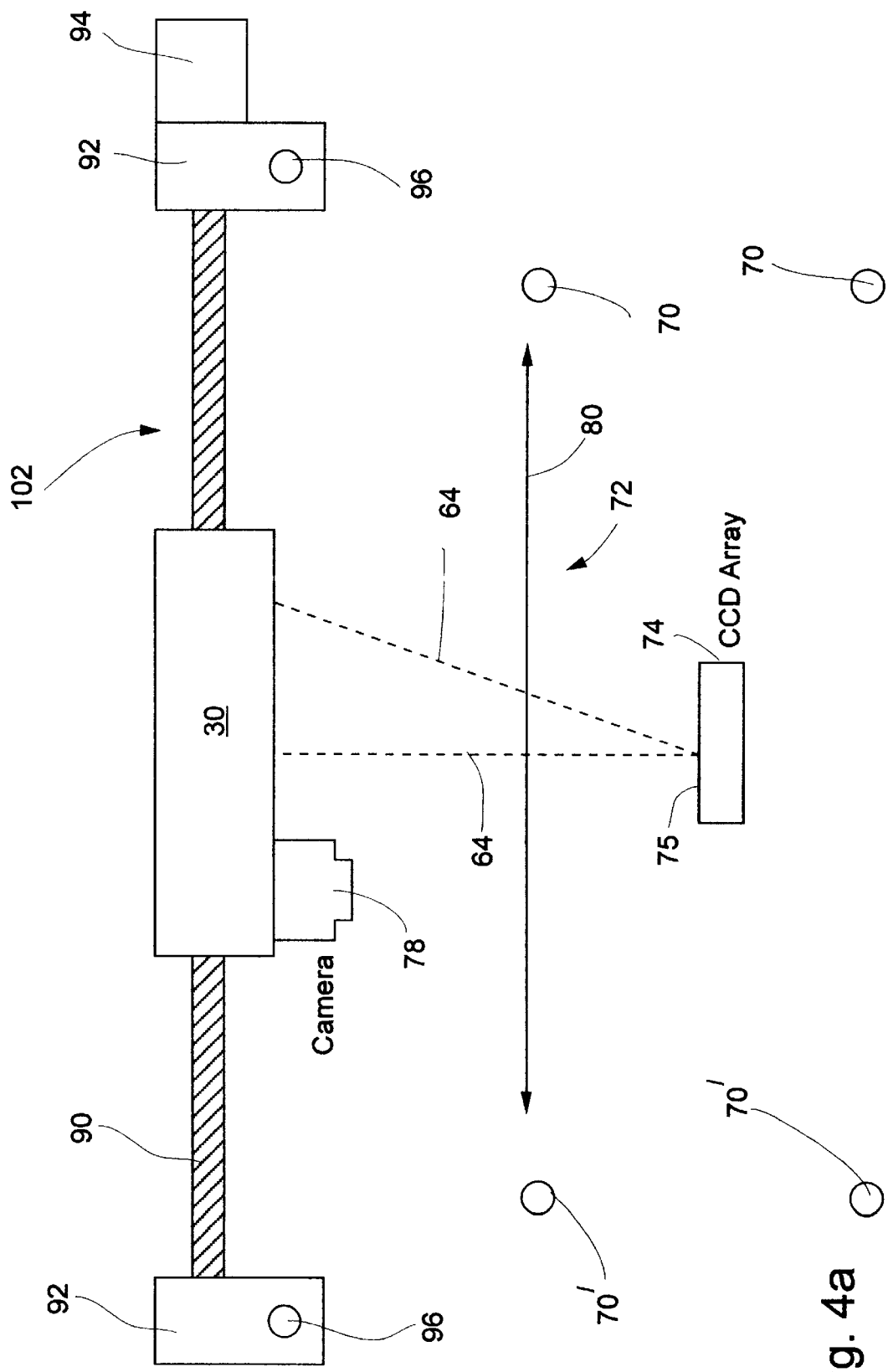
FIGS. 4A and 4B are partial schematic front and side views of an apparatus of the present invention.
Figure 4B:
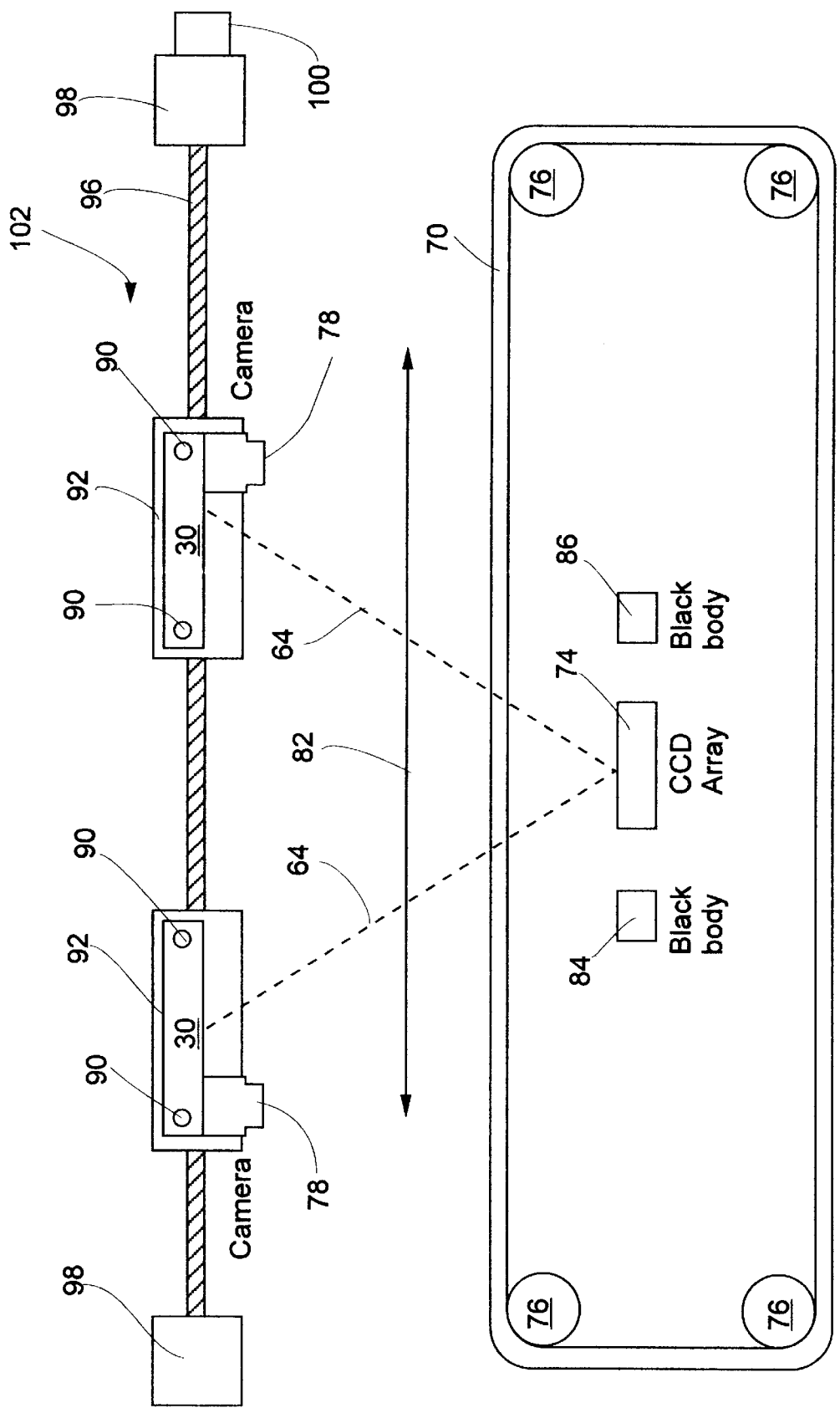

FIGS. 4A and 4B are partial schematic front and side views, respectively, of an apparatus of the present invention. The apparatus includes a conveyor made of two parallel flexible endless bands 70 and 70' driven by rollers 76. Bands 70 and 70' are separated by a gap 72 through which light from optical systems 30 can pass: in that sense, the conveyor of the apparatus is partly transparent to the light from lasers 24 and 26. Bands 70 and 70' are spaced close enough apart to carry circuit boards 16 under optical systems 30 for soldering. Double headed arrows 80 and 82 indicate the extent of a target zone towards which optical systems 30 can aim optical path segments 64.

In between the soldering of successive circuit boards 16, xy scanners 42 of optical systems 30 are calibrated by aiming optical path segments 64 at an aiming point 75 on a CCD array 74 that functions as a calibration sensor. Preferably, CCD array 74 is part of a video camera pointed upwards and with its lens replaced by an attenuator, to attenuate high power light from lasers 24, thereby avoiding damage to CCD array 74. Alternatively, and preferably, low power lasers 26 are used for aiming. A collimated beam of light from each laser 26 follows optical path segments 54 58, 62 and 64 to CCD array 74. Because focused light beams from both lasers 24 and 26 follow common optical paths 64 from xy scanners 42, the aim of xy scanners 42 can be calibrated using the low power light from laser 26 without damage to CCD array 74.

In the particular configuration illustrated in FIGS. 4A and 4B, several optical paths 64 are shown aimed at aiming point 75 using the corresponding xy scanner 42. It will be understood that one or another of xy scanners 42 can be aimed at any point in the target zone. When an xy scanner 42 is aimed at a particular point, optical path segment 64 goes from that xy scanner 42 to that point. To simplify the structure of focusing optics 68, and, in particular, to allow xy scanners 42 to have only limited motion around vertical incidence of optical paths 64 on circuit boards 16, optical systems 30 are mounted on a translational gantry 102 that is partially depicted in FIGS. 4A and 4B. Each optical system 30 is mounted on two parallel transverse rods 90 that span an axial frame 92. At least one of the two transverse rods 90 associated with each optical system 30 is threaded and is driven by a motor 94, which may be a stepping motor or a DC motor, to move the associated optical system 30 transversely with respect to and parallel with the target zone. Axial frames 92 are in turn mounted on parallel threaded axial rods 96. Axial rods 96 in turn span a transverse frame 98. Each axial rod 96 is driven by a stepping motor 100. Each axial rod 96 engages axial frame 92 of a different one of the two optical systems 30, so that optical systems 30 are moved independently axially with respect to and parallel with the target zone.

Figure 5:
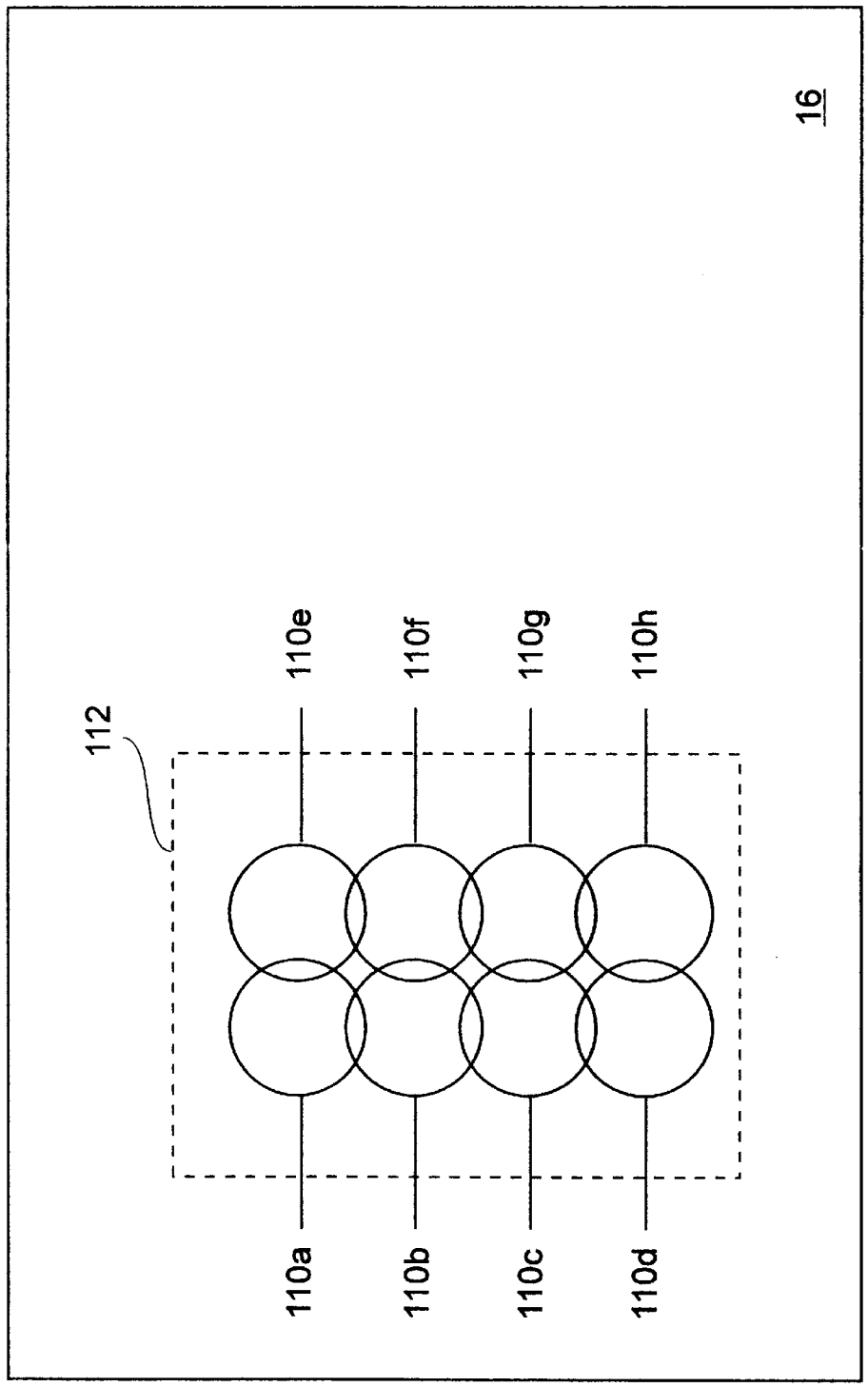
FIG. 5 shows the footprints of the channels of an eight-channel optical system on a circuit board, at one horizontal position of the optical system.

FIG. 5 is a plan view of a circuit board 16 showing footprints 110 of optical paths 64 from an optical system 30 having eight optical channels a through h, at one particular position of optical system 30 with respect to the target zone. The vertical projection of optical system 30 onto circuit board 16 is indicated by a dashed line 112. Note that at one fixed horizontal position of optical system 30, optical paths 64 can be pointed at only a limited portion of circuit board 16 using xy scanners 42 alone. Full coverage of the surface of circuit board 16 requires cooperative movement of optical systems 30, using translational gantry 102, and xy scanners 42.

Each optical system 30 also includes a video camera 78 aimed at the conveyor belt. The function of video camera 78 is to capture images of circuit boards 16 as circuit boards 16 are transported beneath the corresponding optical system 30. Fiducial marks in the captured images are used to orient xy scanners 42 with respect to circuit boards 16 so that optical path segments 64 can be aimed accurately.

Also below the target zone and below gap 80 are two black bodies 84 and 86, which are heated to known temperatures in order to calibrate infrared sensors 28. For the purpose of this calibration, black body 84 is heated to one temperature, black body 86 is heated to another temperature, and xy scanners 42 are aimed sequentially at black bodies 84 and 86. Infrared radiation from black bodies 84 and 86 follows optical path segments 64, 62 and 60 to infrared sensors 28. Although two black bodies 84 and 86 are illustrated, it is preferable to use four black bodies, at temperatures of 100° C., 150° C., 200° C. and 250° C.

The components illustrated in FIGS. 3, 4A and 4B are mutually connected and controlled by a microprocessor-based control system 32 shown schematically in FIG. 3. Control system 32 can be, for example a personal computer with appropriate peripherals such as A/D cards and frame grabbers. Two functions of control system 32 deserve particular note. Control system 32 monitors the intensity of infrared radiation received by sensors 28. If the intensity of the infrared radiation received by a sensor 28 is anomalously high or anomalously low relative to a nominal intensity, as described above, circuit board 16 is diverted for individual processing outside of the apparatus of the present invention.

For example, a circuit board 16 that exhibits thermal anomalies may be discarded, or may be reprocessed in a rework station. Thus, sensors 28 function as quality control sensors. Control system 32 also monitors the axial positions of optical systems 30 to prevent collisions of optical systems 30. The way in which the illustrated components are connected to the control system and controlled thereby is well known to those skilled in the art and need not be elaborated here.

As noted above, the preferred method for establishing nominal thermal histories of aiming points 66 of a workpiece is to provide, as a calibration piece, a properly assembled workpiece, to direct laser beam energy at calibration points on the calibration piece that correspond to, and represent, aiming points 66 of the workpiece. The reason why this method is preferred over experimental investigations of the temperature-time responses of generic aiming points 66, as was done in the above-cited technical paper of Nicolics et al., is the great variety of aiming points 66 that need to be calibrated.

For example, if the workpiece is circuit board 16, then the calibration piece is a properly assembled circuit board 16, with all components 18 in their proper places and secured to circuit board 18 by correctly formed solder joints; and the calibration points are leads 20. Light from lasers 24 or 26 is directed successively at the calibration points to heat the calibration points, and the resulting infrared emissions from the calibration points are detected by infrared sensors 28. The signals produced by infrared sensors 28 are recorded and used as standards, against which the signals produced by infrared sensors 28 in response to infrared radiation from workpiece aiming points 66 heated by lasers 24 are compared.

In principle, light from lasers 24 can be used to heat the calibration points. Because the light of lasers 24 is sufficiently intense to process aiming points 66 of a workpiece, the light of lasers 24 also is sufficiently intense to damage a calibration piece. Therefore, preferably, light from low powered lasers 26 is used to heat the calibration points. The diagnostic features of the signals produced by sensors 28 are their shapes, as functions of time, rather than their magnitudes. Therefore, the signals produced by sensors 28 in response to the low level of infrared radiation emitted by the calibration points in response to light from lasers 26 can be used as reference standards for the signals produced by sensors 28 in response to the high level of infrared radiation emitted by aiming points 66 in response to light from lasers 24.

While the invention has been described with respect to a limited number of embodiments, it will be appreciated that many variations, modifications and other applications of the invention may be made.

What is claimed is:

1. A method of thermal processing of at least one workpiece location on a workpiece, to produce a processed workpiece, comprising the steps of:
    (a) providing a calibration piece including at least one calibration location, each said at least one calibration location being representative of a corresponding workpiece location on the processed workpiece;
    (b) generating radiation of a first wavelength;
    (c) for each of said at least one calibration location:
        (i) aiming said radiation of said first wavelength at said each calibration location, and
        (ii) detecting intensity of radiation of a second wavelength emitted from said each calibration location when said radiation of said first wavelength impinges on said each calibration location;

(d) generating radiation, of a third wavelength, having an intensity sufficient to effect the thermal processing; and (e) for each of the at least one workpiece location:
   (i) aiming said radiation of said third wavelength at said each workpiece location,
   (ii) detecting intensity of radiation of said second wavelength emitted from said each workpiece location when said radiation of said third wavelength impinges on said each calibration location,
   (iii) comparing said intensity of said radiation of said second wavelength, emitted from said each workpiece location, with said intensity of said radiation of said second wavelength, emitted from said calibration location representative of said each workpiece location, and
   (iv) based on said comparing, deciding whether to divert the workpiece for individual processing.

2. The method of claim 1, wherein said second wavelength is longer than said first and third wavelengths.

3. The method of claim 1, wherein said radiation of said second wavelength is infrared radiation.

4. The method of claim 1, wherein said detecting is effected using a sensor, the method further comprising the step of:

(f) calibrating said sensor using at least one black body heated to a known temperature.

* * * * *